United States Patent [19]
Dhong et al.

[11] Patent Number: 6,104,213
[45] Date of Patent: *Aug. 15, 2000

[54] DOMINO LOGIC CIRCUIT HAVING A CLOCKED PRECHARGE

[75] Inventors: Sang Hoo Dhong; Uttam Shyamalindu Ghoshal, both of Austin, Tex.; Joel Abraham Silberman, Somers, N.Y.; Osamu Takahashi, Round Rock, Tex.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 09/032,820

[22] Filed: Mar. 2, 1998

[51] Int. Cl.[7] ............... H03K 19/096; H03K 19/0175; H03K 3/01

[52] U.S. Cl. .............. 326/98; 326/112; 326/83; 327/534

[58] Field of Search .................... 326/98, 97, 93, 326/95, 96, 112, 119, 121, 83, 86; 327/534

[56] References Cited

U.S. PATENT DOCUMENTS

| | | |
|---|---|---|
| 3,601,627 | 8/1971 | Booher ........................ 326/95 |
| 4,569,032 | 2/1986 | Lee . |
| 4,656,417 | 4/1987 | Kirkpatrick et al. . |
| 4,668,880 | 5/1987 | Shoji . |
| 5,004,936 | 4/1991 | Andresen ..................... 326/27 |
| 5,015,882 | 5/1991 | Houston et al. . |
| 5,434,526 | 7/1995 | Tanigshira et al. ........... 327/389 |
| 5,552,723 | 9/1996 | Shigehara et al. ............ 326/86 |
| 5,821,769 | 10/1998 | Douseki ....................... 326/34 |

*Primary Examiner*—Michael Tokar
*Assistant Examiner*—James H. Cho
*Attorney, Agent, or Firm*—Casimer K. Salys; Felsman, Bradley, Vaden, Gunter & Dillon, LLP

[57] ABSTRACT

A domino logic circuit having a clocked precharge is disclosed. The domino logic circuit includes a precharge transistor, a discharger transistor, several input transistors, and an invertor. Connected to a power supply, the precharge transistor receives a first clock input. The discharge transistor, connected to the ground, receives a second clock input. The input transistors is coupled between the precharge transistor and the discharge transistor. Each of the input transistors receives a signal input. The inverter has an input coupled to the precharge transistor, and an output to yield a signal output. The inverter includes a first transistor and a second transistor connected in series, and the output of the inverter is connected to a body of the first transistor.

12 Claims, 3 Drawing Sheets

DOMINO LOGIC CIRCUIT HAVING A CLOCKED PRECHARGE

BACKGROUND OF THE INVENTION

1. Technical Field

The present invention relates to semiconductor circuits in general, and in particular to domino type logic circuits. Still more particularly, the present invention relates to a domino logic circuit having a clocked precharge.

2. Description of the Prior Art

A domino type of logic circuit simplifies digital logic by connecting a number of transistors together in series to implement digital combination logic. For example, a domino logic circuit implements a logic AND function by cascading a P-channel transistor with several N-channel input transistors in series. During operation, the P-channel transistor is clocked to precharge an output node of the circuit to a predetermined logic state. Depending on the logic state at the inputs of the N-channel input transistors, the output node either remains at its pre-charged state or is pulled low through the series of N-channel input transistors by a clocked N-channel transistor connected to ground.

In accordance with the logic AND function, if all of the N-channel input transistors are driven by a logic high signal, the output node of the domino logic circuit will be a logic low. Conversely, if any one of the N-channel input transistors is driven by a logic low signal, the output node of the domino logic circuit will remain at its precharged logic high state. Because no inversion function is performed with this conventional arrangement, an inverter is generally employed at the output of the domino logic circuit to perform a logic inversion function such that an overall logic AND function is realized.

The present disclosure describes an improved domino logic circuit that is able to provide an output signal faster than the conventional domino logic circuit described above.

SUMMARY OF THE INVENTION

In view of the foregoing, it is therefore an object of the present invention to provide an improved semiconductor circuit.

It is another object of the present invention to provide an improved domino-type logic circuit.

It is yet another object of the present invention to provide an improved domino logic circuit having a clocked precharge.

In accordance with a preferred embodiment of the present invention, a domino logic circuit includes a precharge transistor, a discharge transistor, several input transistors, and an invertor. Connected to a power supply, the precharge transistor receives a first clock input. The discharge transistor, connected to the ground, receives a second clock input. The input transistors are coupled between the precharge transistor and the discharge transistor. Each of the input transistors receives a signal input. The inverter has an input coupled to the precharge transistor and an output that yields a signal output. The inverter includes a first transistor and a second transistor connected in series, and the output of the inverter is connected to a body of the first transistor.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIG. 3b is a process cross-sectional view of the inverter from FIG. 3a.

DESCRIPTION OF A PREFERRED EMBODIMENT

Figure 1:
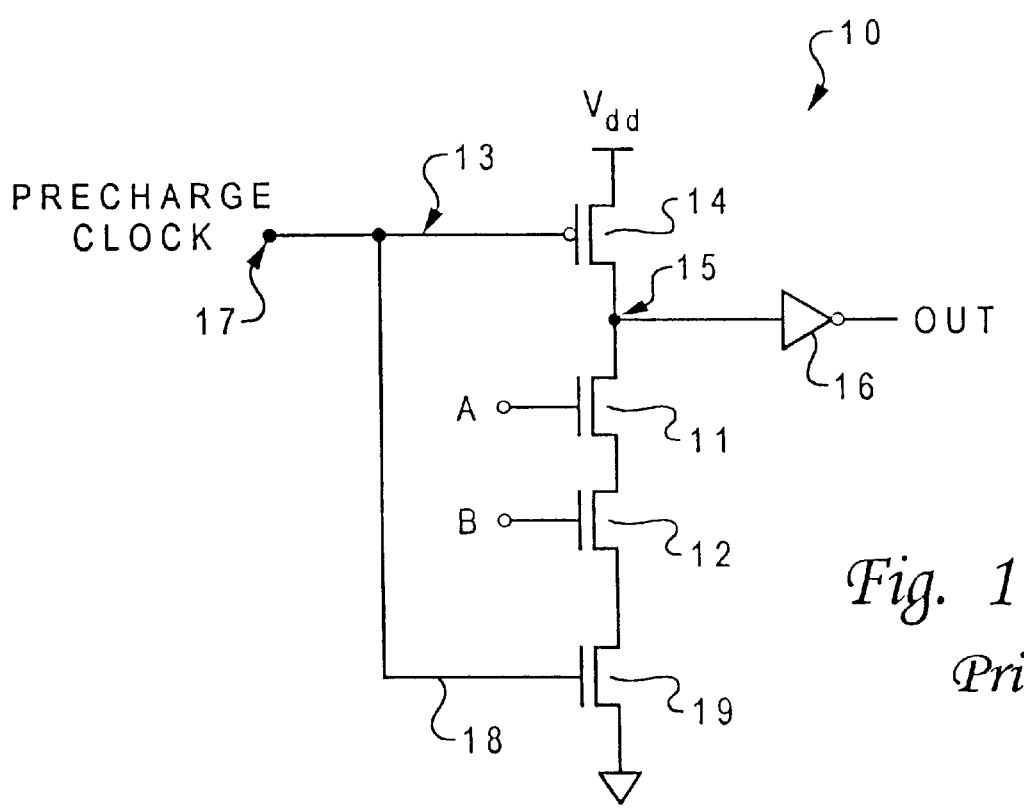
FIG. 1 is a circuit diagram of a conventional two-input CMOS domino logic circuit.

Referring now to the drawings and in particular to FIG. 1, there is depicted a circuit diagram of a conventional two-input complementary metal-oxide semiconductor (CMOS) domino logic circuit. As shown, domino logic circuit 10 includes two input transistors-input transistor 11 and input transistor 12. Input transistors 11, 12 are connected to each other in what is known as a cascaded arrangement. Input transistors 11 and 12 are generally N-channel (NMOS) enhancement mode devices, each having a respective one of inputs A and B. Thus, when a logic high signal is applied to any one of inputs A and/or B, an associated one of input transistors 11, 12 is turned on. In other words, a conduction channel is formed between the source and drain terminals of the respective transistors.

An output indication of the conduction in both transistors 11, 12 can be determined at node 15. Node 15 is also connected to a P-channel (PMOS) precharge transistor 14 having a drain connected to a supply voltage $V_{dd}$. When precharge transistor 14 is driven into conduction, such as by a logic low signal at a gate 13, the supply voltage $V_{dd}$, coupled through precharge transistor 14, will manifest at node 15. Node 15 is thus precharged to a voltage which represents a logic high. According to the conventional operation of CMOS circuits, when precharge transistor 14 is turned off, node 15 will remain precharged to the supply voltage $V_{dd}$ until both of input transistors 11, 12 is driven into conduction. An inverter 16 is connected between node 15 and the output of domino logic circuit 10. The complement of a signal appearing at node 15 appears at the output of inverter 16.

A clock input 17 is connected to gate 13 of precharge transistor 14, as well as to a gate 18 of a discharge transistor 19. The drain of discharge transistor 19 is connected to the source of input transistor 12; and the source of discharge transistor 19 is connected to the ground. Thus, when a logic high signal is applied to gate 18, discharge transistor 19 is driven into conduction, thereby grounding the source of input transistor 12.

In performing a logic AND function, a precharge clock signal is applied at clock input 17 by a precharge clock. During the low portion of the precharge clock signal, precharge transistor 14 is rendered conductive, discharge transistor 19 is made non-conductive, and node 15 will be precharged to a supply voltage of $V_{dd}$. Conversely, during the high portion of the precharge clock signal, precharge transistor 14 is rendered non-conductive, discharge transistor 19 is made conductive, and the source of input transistor 12 will be precharged to a logic low. It is during the high portion of the precharge clock signal that digital signals are applied to inputs A and B. In the event that logic high signals are applied to both inputs A and B, respective input transistors 11, 12 will be turned on such that discharge transistor 19 will pull node 15 to a logic low. Inverter 16 then inverts the logic low at node 15 to provide an output logic high at the output of inverter 16. As a result, an AND logic function is thereby realized.

Figure 2:
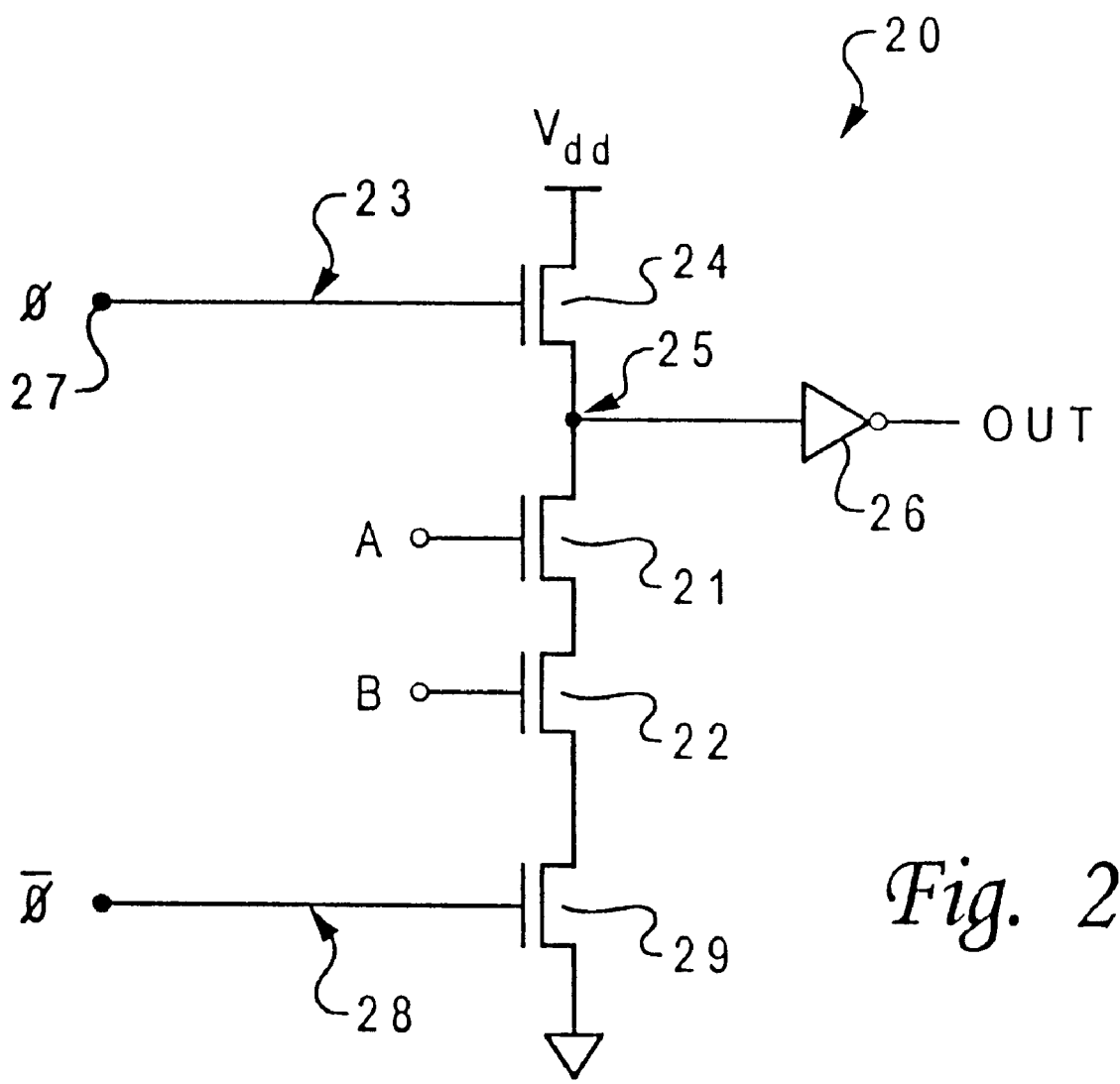
FIG. 2 is a circuit diagram of a two-input CMOS domino logic circuit, in accordance with a preferred embodiment of the present invention.

With reference now to FIG. 2, there is depicted a circuit diagram of a two-input CMOS domino logic circuit, in accordance with a preferred embodiment of the present invention. Domino logic circuit 20 also includes two input transistors-input transistor 21 and input transistor 22. Input transistors 21, 22, both preferably N-channel enhancement mode devices, are connected to each other in a cascaded arrangement. Each of input transistors 21, 22 has a respective input A and B, and when a logic high is applied to one of inputs A and B, the associated one of input transistors 21, 22 will be turned on. Although only two input transistors 21 and 22 are utilized to illustrate the present invention, it is understood by those skilled in the art of CMOS circuit design that more than two input transistors may be added inseries to domino logic circuit 20.

In addition, domino logic circuit 20 includes an N-channel precharge transistor 24 connected between a power supply having a voltage $V_{dd}$ and input transistors 21, 22. When precharge transistor 24 is driven into conduction, such as by a logic high signal at a gate 23, the supply voltage, coupled through precharge transistor 24, will manifest at a node 25. Thus, node 25 is precharged to a voltage that represents a logic high at this point. Even when precharge transistor 24 is turned off afterwards, node 25 will remain precharged to a logic high, until both of input transistors 21, 22 are driven into conduction.

Also, an inverter 26 is connected between node 25 and the output of domino logic circuit 20. The complement of a signal appearing at node 25 appears at the output of inverter 26.

A clock input 27 is connected to gate 23 of precharge transistor 24, and a complement of clock input 27 is connected to a gate 28 of an N-channel discharge transistor 29. The drain of discharge transistor 29 is connected to the source of input transistor 22; and the source of discharge transistor 29 is connected to the ground. Thus, when a logic high signal is applied to gate 28, discharge transistor 29 is driven into conduction, thereby grounding the source of input transistor 22.

In performing a logic AND function, clock input 27 is supplied by a precharge clock (not shown). During the low portion of the precharge clock signal, precharge transistor 24 is rendered nonconductive, discharge transistor 29 is made conductive, and the source of input transistor 22 is precharged to a logic low. During the high portion of the precharge clock signal, precharge transistor 24 is rendered conductive, discharge transistor 29 is made non-conductive, and node 25 will be precharged to a supply voltage of $V_{dd}$. It is during the low portion of the precharge clock signal that digital signals are applied to inputs A and B of input transistors 21 and 22, respectively. When logic high signals are applied to inputs A and B simultaneously, respective input transistors 21, 22 will be turned on, and discharge transistor 29 will pull node 25 to a logic low. Inverter 26 inverts the logic low at node 25 and provides a logic high at the output of inverter 26. As a result, an AND logic function is realized.

In a preferred embodiment of the present invention, precharge transistor 24 is a zero-threshold voltage or at least a very low-threshold voltage (<0.1 $V_{dd}$) transistor. This is preferable because node 25 will be pre-charged to exactly $V_{dd}-V_t$, where $V_t$ is the threshold voltage of precharge transistor 24; thus the threshold voltage of precharge transistor 24 is preferably minimized. In addition, precharge transistor 24 is preferably an N-channel transistor instead of a P-channel transistor as in the conventional implementation illustrated in FIG. 1 because the junction capacitance at the drain of an N-channel transistor in an N-well process is much less than the junction capacitance at the drain of a P-channel transistor in an N-well process. A lower junction capacitance results in lower capacitance, which allows for a larger precharge transistor that enables higher precharge current and lesser precharge time.

Figure 3A:
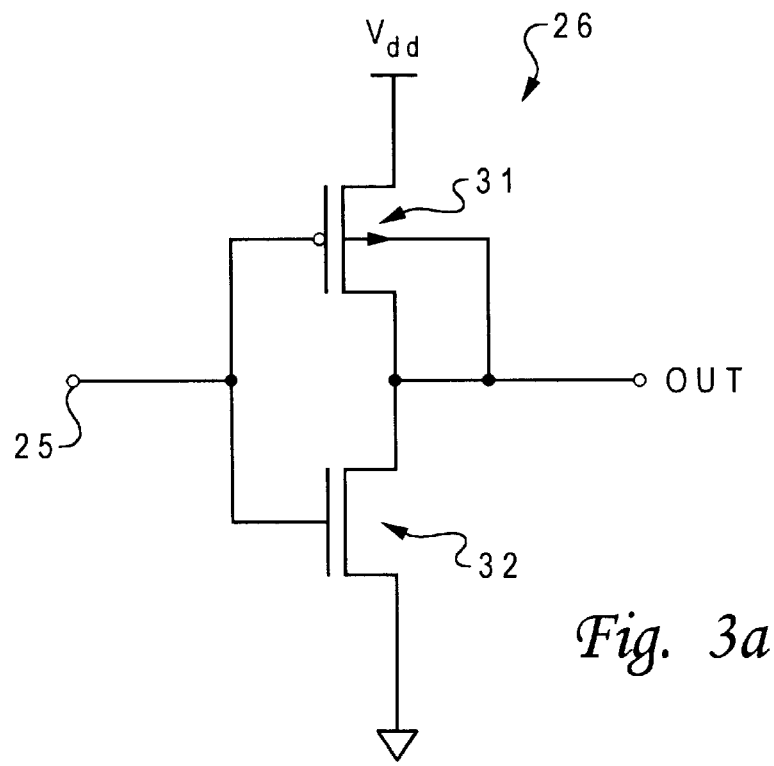
FIG. 3a is a circuit diagram of an inverter within the domino logic circuit from FIG. 2, in accordance with a preferred embodiment of the present invention.

In order to speed up the output of domino logic circuit 10, a modification can also be made to inverter 26. With reference now to FIG. 3a, there is illustrated a circuit diagram of inverter 26 in accordance with a preferred embodiment of the present invention. As shown, inverter 26 includes a P-channel transistor 31 connected in series with an N-channel transistor 32. The source of P-channel transistor 31 is connected to power supply $V_{dd}$ and the source of N-channel transistor 32 is connected to the ground. The gates of both transistors 31 and 32 are connected to node 25 of domino logic circuit 20 (from FIG. 2). The drains of both transistors 31 and 32 are connected together as the output for domino logic circuit 20. In addition, the source of P-channel transistor 31 is also connected to the body of P-channel transistor 31 to increase the drive for any capacitive load at the output of domino logic circuit 20. It is understood by those who are skilled in the art of CMOS circuit design that the body of a P-channel transistor is an N-well in which the P-channel transistor is fabricated.

Figure 3B:
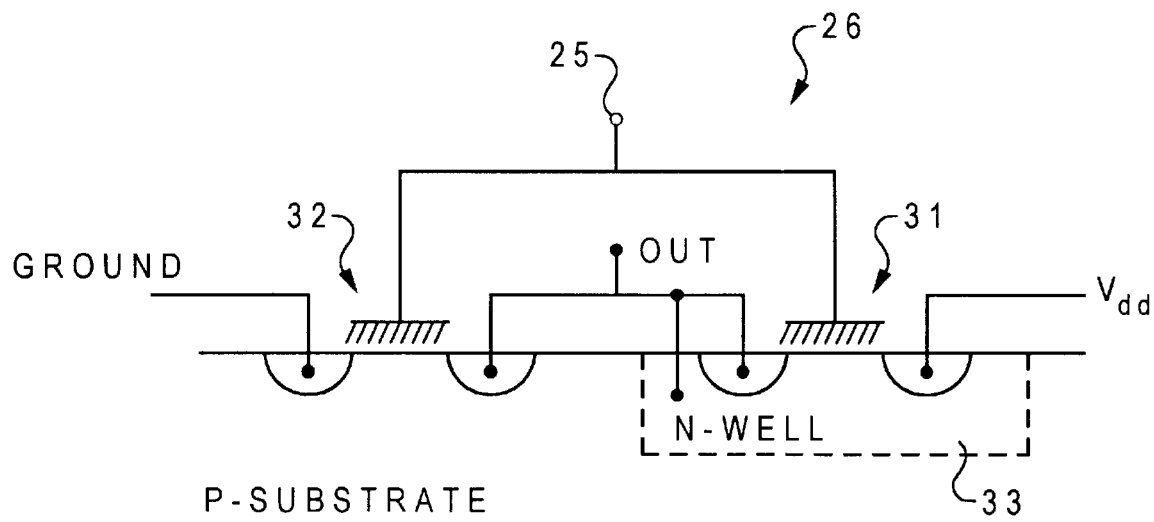

With reference now to FIG. 3b, there is illustrated a process cross-sectional view of inverter 26 from FIG. 3a. As shown, the source of P-channel transistor 31 of inverter 26 is connected to an N-well 33 in which P-channel transistor 31 of inverter 26 is embedded. The result of having the source of P-channel transistor 31 connected to N-well 33 is that when the output of domino logic circuit 20 is low, the threshold voltage of P-channel transistor 31 is also low. Then, as the input of domino logic circuit 20 drops to zero to change the output, P-channel transistor 31 has a zero threshold voltage and drives much more current to charge up any load at the output. Once the output goes high, P-channel transistor 31 has the standard threshold because the body of P-channel transistor 31 is connected to the output also.

As has been described, the present invention provides an improved domino logic circuit having a clocked precharge. The increase in speed for the P-channel transistor in an invertor within the improved domino logic circuit is in the range of approximately 10% depending on the capacitance of load at the output. All the P-channel transistors within the improved domino logic circuit are fabricated in an N-well, and, as such, the body of these P-channel transistors can be isolated.

While the invention has been particularly shown and described with reference to a preferred embodiment, it will be understood by those skilled in the art that various changes in form and detail may be made therein without departing from the spirit and scope of the invention.

What is claimed is:

1. A domino logic circuit, comprising:
   a precharge transistor connected to a power supply, wherein said precharge transistor receives a first clock input;
   a discharge transistor connected to ground, said discharge transistor receives a second clock input;

one or more input transistors coupled between said precharge transistor and said discharge transistor, wherein each of said one or more input transistors receives a signal input; and an inverter having an input coupled to said precharge transistor and an output to yield a signal output, wherein said inverter includes a first transistor and a second transistor connected in series, wherein said output is directly connected to a body of said first transistor.

2. The domino logic circuit according to claim 1, wherein said first transistor is a P-channel transistor, said second transistor is an N-channel transistor, and said body is an N-well.

3. The domino logic circuit according to claim 2, wherein said first clock is complement to said second clock.

4. The domino logic circuit according to claim 3, wherein said precharge transistor and said discharge transistor are N-channel transistors.

5. The domino logic circuit according to claim 4, wherein said precharge transistor is a zero-threshold or low-threshold transistor.

6. The domino logic circuit according to claim 4, wherein said plurality of transistors are N-channel transistors.

7. A domino logic circuit having a clocked precharge, comprising:

a precharge transistor having a source connected to a power supply, for receiving a first clock input;

a discharge transistor having a source connected to the ground, for receiving a second clock input;

a plurality of transistors coupled between a drain of said precharge transistor and a drain of said discharge transistor, wherein each of said plurality of transistors receives a signal input; and an inverter having an input coupled to said drain of said precharge transistor, and an output to yield a signal output, wherein said inverter includes a first transistor and a second transistor connected in series, wherein said output is directly connected to a body of said first transistor.

8. The domino logic circuit according to claim 7, wherein said first transistor is a P-channel transistor, said second transistor is an N-channel transistor, and said body is an N-well.

9. The domino logic circuit according to claim 8, wherein said first clock is complement to said second clock.

10. The domino logic circuit according to claim 9, wherein said precharge transistor and said discharge transistor are N-channel transistors.

11. The domino logic circuit according to claim 10, wherein said precharge transistor is a zero-threshold or low-threshold transistor.

12. The domino logic circuit according to claim 10, wherein said plurality of transistors are N-channel transistors.

* * * * *